(12) United States Patent
Chen et al.

(10) Patent No.: US 11,231,702 B2
(45) Date of Patent: Jan. 25, 2022

(54) METHOD, DEVICE AND SYSTEM FOR HEALTH MONITORING OF SYSTEM-ON-CHIP

(71) Applicant: Fifth Electronics Research Institute of Ministry of Industry and Information Technology, Guangzhou (CN)

(72) Inventors: Yiqiang Chen, Guangzhou (CN); Dengyun Lei, Guangzhou (CN); Yunfei En, Guangzhou (CN); Wenxiao Fang, Guangzhou (CN); Bo Hou, Guangzhou (CN); Yuan Liu, Guangzhou (CN); Yun Huang, Guangzhou (CN)

(73) Assignee: Fifth Electronics Research Institute of Ministry of Industry and Information Technology

( * ) Notice: Subject to any disclaimer, the term of this patent is extended or adjusted under 35 U.S.C. 154(b) by 130 days.

(21) Appl. No.: 15/554,581

(22) PCT Filed: Nov. 29, 2016

(86) PCT No.: PCT/CN2016/107703
§ 371 (c)(1),
(2) Date: Aug. 30, 2017

(87) PCT Pub. No.: WO2018/006539
PCT Pub. Date: Jan. 11, 2018

(65) Prior Publication Data
US 2019/0064786 A1  Feb. 28, 2019

(30) Foreign Application Priority Data

Jul. 7, 2016 (CN) .......................... 201610532420.3

(51) Int. Cl.
*G05B 23/02* (2006.01)
*G01R 31/28* (2006.01)

(52) U.S. Cl.
CPC ...... *G05B 23/0213* (2013.01); *G01R 31/2856* (2013.01); *G01R 31/2872* (2013.01); *G01R 31/2894* (2013.01); *G05B 23/0243* (2013.01)

(58) Field of Classification Search
CPC ............ G05B 23/0213; G05B 23/0423; G05D 27/02; G06F 1/28
See application file for complete search history.

(56) References Cited

U.S. PATENT DOCUMENTS

| | | |
|---|---|---|
| 6,696,849 B2 | 2/2004 | Ban et al. |
| 2003/0122566 A1 | 7/2003 | Takahashi et al. |

(Continued)

FOREIGN PATENT DOCUMENTS

| | | |
|---|---|---|
| CN | 1240939 A | 1/2000 |
| CN | 1345086 A | 4/2002 |

(Continued)

OTHER PUBLICATIONS

International Search Report and Written Opinion for Application No. PCT/CN2016/107703 dated Apr. 12, 2017.

(Continued)

*Primary Examiner* — Catherine T. Rastovski
(74) *Attorney, Agent, or Firm* — Lerner, David, Littenberg, Krumholz & Mentlik, LLP

(57) ABSTRACT

Disclosed are a method, device and system for health monitoring of SoC. The method includes: acquiring in real time sensor data of sensors monitoring SoC performance, the sensor data including reliability degradation sensor data, temperature sensor data, noise sensor data and current sensor data; extracting characteristic data representative of the SoC performance from the sensor data; performing analysis and prediction on the characteristic data in real time by using a prediction algorithm to obtain a performance state and a performance degradation trend of the SoC; outputting per- (Continued)

formance state information and performance degradation trend information of the SoC. The disclosed method, device and system for health monitoring of SoC can monitor the performance state of the SoC in real time and predict the performance degradation trend of the SoC in real time.

8 Claims, 3 Drawing Sheets

(56) References Cited

U.S. PATENT DOCUMENTS

| | | |
|---|---|---|
| 2008/0278226 A1 | 11/2008 | Miao |
| 2008/0301474 A1 | 12/2008 | Bussa et al. |
| 2010/0127729 A1 | 5/2010 | Zjajo |
| 2011/0173432 A1* | 7/2011 | Cher .................. G06F 30/30 713/100 |
| 2012/0259575 A1* | 10/2012 | Graas ............... G01R 31/3187 702/120 |
| 2012/0274397 A1 | 11/2012 | Au et al. |
| 2013/0136162 A1* | 5/2013 | Gotou ................... H02M 3/156 375/219 |
| 2013/0169347 A1 | 7/2013 | Kim et al. |
| 2014/0032949 A1 | 1/2014 | Kim et al. |
| 2014/0088947 A1* | 3/2014 | Anemikos ........ G11C 29/12005 703/14 |
| 2014/0225639 A1 | 8/2014 | Guo et al. |
| 2015/0192637 A1 | 7/2015 | Falk et al. |
| 2016/0104705 A1 | 4/2016 | Chung et al. |
| 2016/0265982 A1 | 9/2016 | Bachand et al. |
| 2016/0291665 A1 | 10/2016 | Wang et al. |
| 2017/0039309 A1 | 2/2017 | Wang et al. |

FOREIGN PATENT DOCUMENTS

| | | | |
|---|---|---|---|
| CN | 101395558 A | | 3/2009 |
| CN | 101675349 A | | 3/2010 |
| CN | 101675589 A | | 3/2010 |
| CN | 103197747 A | | 7/2013 |
| CN | 103576717 A | | 2/2014 |
| CN | 104345753 A | | 2/2015 |
| CN | 104471583 A | | 3/2015 |
| CN | 204291237 | * | 4/2015 |
| CN | 104598308 A | | 5/2015 |
| CN | 104969468 A | | 10/2015 |
| CN | 105045180 A | | 11/2015 |
| CN | 105445569 A | | 3/2016 |
| CN | 105445645 A | | 3/2016 |
| CN | 105514165 A | | 4/2016 |
| CN | 106020170 A | | 10/2016 |
| CN | 106021059 A | | 10/2016 |
| JP | 2011038802 A | | 2/2011 |
| WO | WO-2016026846 A1 | * | 2/2016 ....... G01R 31/31725 |

OTHER PUBLICATIONS

First Search Report and Office Action of Piriority Chinese Patent Application No. 201610532420.3, dated Jan. 29, 2018.
Supplemental Search Report and Second Office Action of Piriority Chinese Patent Application No. 201610532420.3, dated Nov. 5, 2018.

* cited by examiner

METHOD, DEVICE AND SYSTEM FOR HEALTH MONITORING OF SYSTEM-ON-CHIP

CROSS REFERENCE TO RELATED APPLICATIONS

The present application is a national phase entry under 35 U.S.C. § 371 of International Application No. PCT/CN2016/107703, filed Nov. 29, 2016, which claims priority from Chinese Patent Application No. 201610532420.3 filed Jul. 7, 2016, all of which are hereby incorporated herein by reference.

TECHNICAL FIELD

The present disclosure relates to the field of System-on-Chip, and more particularly, to a method, device and system for health monitoring of System-on-Chip.

BACKGROUND

The design requirements of System-on-Chip (SoC) have changed from simply seeking for high performance and small area to comprehensive requirements of performance, area, power consumption and reliability. Especially, SoC chips have been widely used in high-reliability required fields, such as aerospace, rail traffic and nuclear power, etc., and their reliability is of great importance and attracts much attention. Conventional off-line reliability evaluation methods, such as reliability simulation, on-line process detection and reliability test and failure analysis, etc. cannot predict the service life of SoC in real time. In this case, the conventional maintenance mode of "regular maintenance" or "afterwards maintenance" would lead to huge losses in human resources, financial resources and material resources.

SUMMARY

In view of this, the present disclosure provides a method, device and system for health monitoring of SoC, which can monitor the performance state of SoC in real time and predict the performance degradation trend of SoC in real time.

In one aspect, the present disclosure provides a method for health monitoring of SoC, including:

acquiring in real time sensor data of sensors monitoring SoC performance, the sensor data includes reliability degradation sensor data, temperature sensor data, noise sensor data and current sensor data;

extracting characteristic data representative of the SoC performance from the sensor data; performing analysis and prediction on the characteristic data in real time by using a prediction algorithm to obtain a performance state and a performance degradation trend of the SoC; and outputting performance state information and performance degradation trend information of the SoC.

In another aspect, the present disclosure provides a device for health monitoring of SoC, including:

a data acquisition module, configured to acquire in real time sensor data of sensors monitoring SoC performance, the sensor data including reliability degradation sensor data, temperature sensor data, noise sensor data and current sensor data;

an analysis and prediction module, configured to obtain a performance state and a performance degradation trend of the SoC by extracting characteristic data representative of the SoC performance from the sensor data and performing analysis and prediction on the characteristic data in real time by using a prediction algorithm; and an information output module, configured to output performance state information and performance degradation trend information of the SoC.

In another aspect, the present disclosure provides an SoC system, including: a system hardware layer, a system kernel layer, a system service layer and an application layer;

wherein, sensors of the system hardware layer are configured to monitor SoC performance in real time;

an operation system kernel of the system kernel layer is configured to acquire sensor data of the system hardware layer in real time and transmit the sensor data to the system service layer; the sensor data includes reliability degradation sensor data, temperature sensor data, noise sensor data and current sensor data;

a prediction module of the system service layer is configured to extract characteristic data representative of the SoC performance from the sensor data, and perform analysis and prediction on the characteristic data in real time by using a prediction algorithm to obtain a performance state and a performance degradation trend of the SoC; and an application (APP) pre-set in the application layer is configured to output performance state information and performance degradation trend information of the SoC system.

The above-mentioned technical solutions are realized by: acquiring in real time sensor data of sensors monitoring SoC performance, the sensor data including reliability degradation sensor data, temperature sensor data, noise sensor data and current sensor data; extracting characteristic data representative of the SoC performance from the sensor data; performing analysis and prediction on the characteristic data in real time by using the prediction algorithm to obtain performance state and performance degradation trend of the SoC; and outputting performance state information and performance degradation trend information of the SoC system. The technical solutions of the present disclosure can provide real-time health monitoring information and real-time predicting information of SoC.

DETAILED DESCRIPTION OF DISCLOSED EMBODIMENTS

In order to make the purpose, technical solutions and advantages of the present disclosure to be understood more clearly, the present disclosure will be described in further details with the accompanying drawings and the following embodiments. It should be understood that the specific embodiments described herein are merely examples to illustrate the present disclosure, not to limit the present disclosure.

Figure 1:
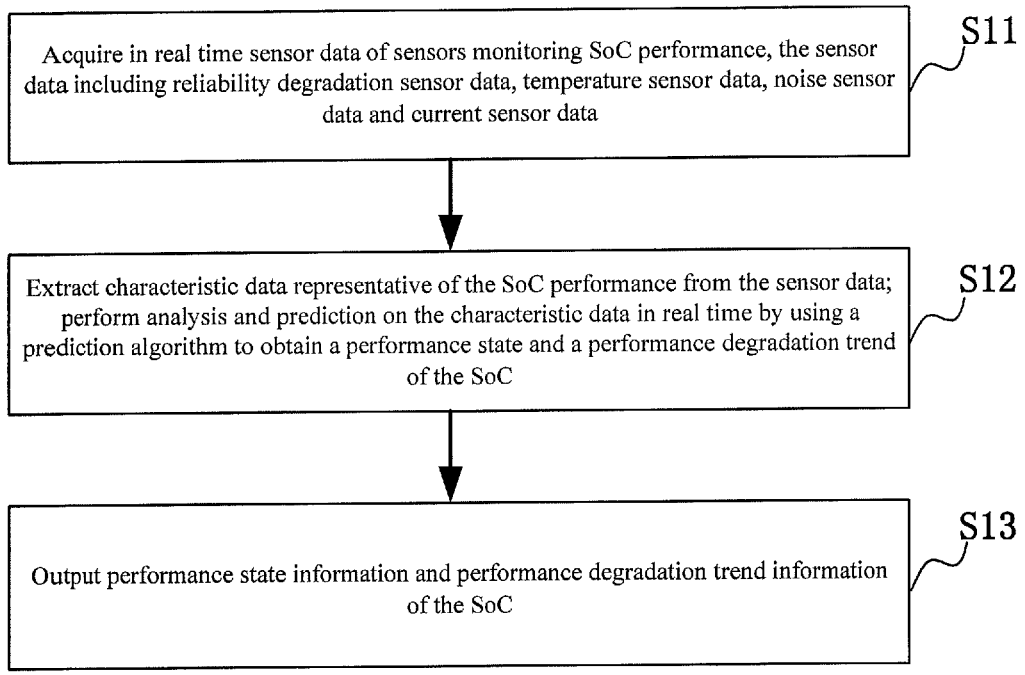
FIG. 1 is a schematic flow chart illustrating the method for health monitoring of SoC according to one embodiment of the present disclosure.

FIG. 1 is a schematic flow chart illustrating the method for health monitoring of SoC according to one embodiment of the present disclosure. As shown in FIG. 1, the method for health monitoring of SoC according to this embodiment includes the following steps:

S11, acquiring in real time sensor data of sensors monitoring SoC performance, the sensor data including reliability degradation sensor data, temperature sensor data, noise sensor data and current sensor data.

Preferably, the reliability degradation sensor data includes time dependent dielectric breakdown (TDDB) degradation sensor data, hot carrier injection (HCI) degradation sensor data and bias temperature instability (BTI) degradation sensor data.

It should be noted that the sensors for monitoring SoC performance in the present disclosure may include a wide variety of sensors; although some sensors have been listed as above, it is to be understood that any other sensors that can be implemented on an SoC are also within the scope of the present disclosure.

S12, extracting characteristic data representative of the SoC performance from the sensor data; performing analysis and prediction on the characteristic data in real time by using the prediction algorithm to obtain a performance state and a performance degradation trend of the SoC.

Preferably, Gabor transform algorithm or fast Fourier transform algorithm can be used to extract the characteristic data representative of the SoC performance from the sensor data. Gabor transform belongs to windowing Fourier transform, and Gabor function can be used to extract related characteristics at different frequency domain scales and different directions. In addition, Gabor function is often used in texture recognition with a better effect as it is similar to biological functions of human eyes. Fast Fourier transform (FFT) can significantly reduce the number of times of multiplication required for the calculation of the discrete Fourier transform by the computer; in particular, the more sampling points N to be transformed, the greater the reduction in calculation amount of FFT algorithm. It should be noted that the method for extracting characteristic data representative of the SoC performance from the sensor data is not limited to these two methods described herein, and other methods for extracting characteristic data are also applicable.

The algorithms for predicting the performance degradation trend in the embodiments of the present disclosure may include a wide variety of algorithms, and are not particularly limited to the present disclosure.

S13, outputting the performance state and the performance degradation trend.

The obtained information of performance state of SoC and performance degradation trend information are sent to an application layer, and then a corresponding APP of the application layer can output the performance state and the performance degradation trend. For example, a health monitoring and pre-warning APP is set in advance, and the performance state and the performance degradation trend can be outputted by the display interface of the APP, which facilitates users to view the health state and the reliability degradation trend of SoC in real time.

It should be noted that when the performance state or the performance degradation trend of SoC obtained in step S12 exceeds the respective corresponding threshold, a corresponding warning alert may be outputted, for example, by outputting the pre-determined warning alert information through the health monitoring and pre-warning APP, so as to facilitate users to make maintenance timely, preventing against more serious problems.

Figure 2:
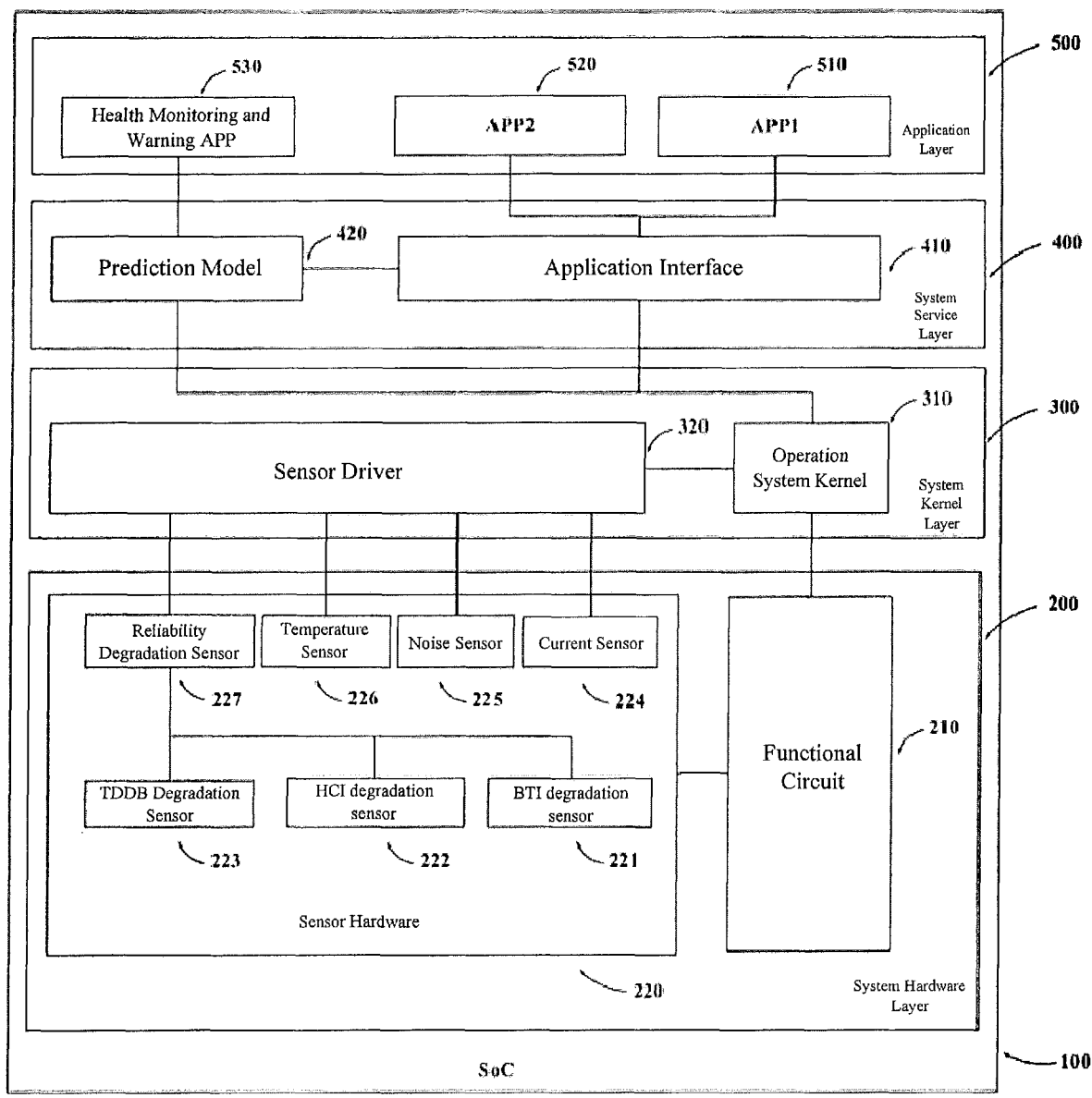
FIG. 2 is a diagram illustrating one specific application scenario of the method for health monitoring of SoC.

FIG. 2 is a diagram illustrating one specific application scenario of the method for health monitoring of SoC according to one embodiment of the present disclosure. As shown in FIG. 2, the SoC system 100 includes a system hardware layer 200, a system kernel layer 300, a system service layer 400 and an application layer 500. The system hardware layer 200 includes a functional circuit 210 and sensors 220, wherein sensors 220 mainly include a reliability degradation sensor 227, a temperature sensor 226, a noise sensor 225 and a current sensor 224. The reliability degradation sensor 227 mainly includes a TDDB degradation sensor 223, an HCI degradation sensor 222 and a BTI degradation sensor 221. The system kernel layer 300 includes an operation system kernel 310 and a sensor driver 320. The system service layer 400 includes an application interface 410 and a prediction module 420. The application layer 500 includes several APPs, such as APP1 510, APP2 520, and health monitoring and pre-warning APP 530, etc.

With respect to the method for health monitoring of SoC, it is required to perform in advance the sensor hardware design, sensor driver design, prediction model construction, health monitoring and pre-warning APP design.

The sensor hardware design mainly involves design of the reliability degradation sensor 227, the temperature sensor 226, the noise sensor 225 and the current sensor 224. The reliability degradation sensor 227 mainly includes TDDB degradation sensor data 223, HCI degradation sensor data 222 and BTI degradation sensor data 221. The sensors and the functional circuit 210 together form the system hardware layer 200 of SoC.

The sensor driver design mainly includes designing the driver of the sensor in consideration of the operation system kernel 310.

The prediction model construction mainly includes acquiring sensor data through the interface provided by the operation system kernel 310, performing characteristic extraction on the sensor data, and performing analysis and prediction on the characteristic data in real time by using an algorithm. The prediction model and the application interface 410 together form the system service layer 400 of SoC.

The health monitoring and pre-warning APP design is mainly performed based on the prediction model 420 and the application interface 410 provided by the system service layer 400, with its aim to provide the real-time health monitoring information and real-time predicting information of SoC to users.

The working principle with respect to the application scenario as shown in FIG. 2 is as follows: the sensor hardware designed in the system hardware layer 200 of SoC 100 monitors the SoC performance in real time, the sensor driver 320 of the system kernel layer 300 reads the sensor data of the system hardware layer 200 in real time, the operation system kernel 310 acquires in real time the sensor data read by the sensor driver 320 through a corresponding interface and transmits the sensor data to the prediction module 420 of the system service layer 400; the prediction module 420 performs characteristic extraction, and monitors the characteristic data in real time by using the prediction algorithm, the health monitoring and pre-warning APP 530 in the application layer 500 of SoC 100 displays the obtained prediction results to provide real-time health monitoring information and real-time predicting information to users.

It should be noted that the foregoing embodiments of the method have been described as a series of combinations of actions for convenience of description, but those skilled in the art would appreciate that the present disclosure will not be limited to the described sequence of actions because some of the steps can be performed in a different sequence or simultaneously according to the present disclosure.

Based on the same idea as that of the method for health monitoring of SoC in the above embodiment, the present disclosure further provides a system for health monitoring of SoC, which is configured to perform the method for health monitoring of SoC as described above. For ease of illustration, the schematic structure diagram of the device for health monitoring of SoC according to one embodiment only shows some parts related with the embodiments of the present disclosure. Those skilled in the art would appreciate that the structure shown in the schematic diagram is not intended to limit the system, and the system may have more or fewer components than shown, may combine some components, or may have a different arrangement of the components.

Figure 3:
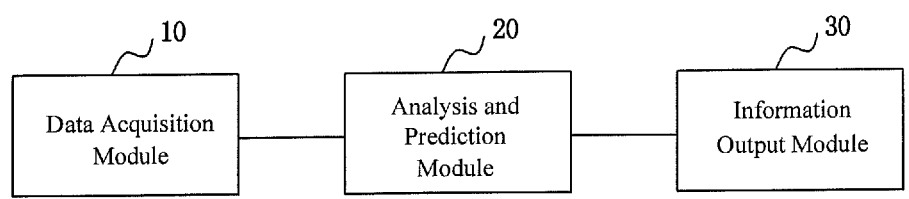
FIG. 3 is a schematic structure diagram illustrating the device for health monitoring of SoC according to one embodiment of the present disclosure.

FIG. 3 is a schematic structure diagram illustrating the device for health monitoring of SoC according to one embodiment of the present disclosure. The device for health monitoring of SoC according to the embodiment includes a data acquisition module 10, an analysis and prediction module 20 and an information output module 30, as described in more details below:

the data acquisition module 10 is configured to acquire sensor data of sensors for monitoring SoC performance in real time, the sensor data including reliability degradation sensor data, temperature sensor data, noise sensor data and current sensor data.

Preferably, the reliability degradation sensor data includes TDDB degradation sensor data, HCI degradation sensor data and BTI degradation sensor data.

The analysis and prediction module 20 is configured to extract characteristic data representative of the SoC performance from the sensor data, and to perform analysis and prediction on the characteristic data in real time by using the prediction algorithm to obtain the performance state and performance degradation trend of SoC.

The information output module 30 is configured to output performance state information of SoC and performance degradation trend information of SoC.

It should be noted that, in implementation of the above example of the device for health monitoring of SoC, since contents such as information interactions and execution procedures among various modules/units are based on the same concept as the embodiment of the method of the present disclosure, and the contents involve the same technical effect as the above-mentioned embodiment of the method does, the details thereof may be obtained with reference to the illustration of the embodiment of the method of the present disclosure, and are not repeated herein.

Furthermore, the logic partitions of functional modules are only exemplary in the implementation of the above example of the device for health monitoring of SoC. In practical applications, the above functions may be distributed and completed by different functional modules according to actual requirements, such as configuration requirements of corresponding hardware, convenience in software implementation, etc. In other words, the internal structure of the device for health monitoring of SoC can be partitioned into different functional modules to complete all or part of the functions as described above. Herein, each of the above functional modules may be implemented in the form of hardware or software functional modules.

Those skilled in the art would understand that all or part of the processes of the embodiments of the method as described above may be realized through computer programs instructing relevant hardware. The programs may be stored in a computer-readable storage medium and may function as an independent product for sale or use, and the programs may include all or part of the steps of the embodiments of the above method when being executed. Wherein, the storage medium may be a diskette, optical disk, ROM (Read-Only Memory) or RAM (Random Access Memory), and so on.

As noted above, the description of each embodiment has its own emphasis, if some parts of one embodiment are not described in detail, references can be made to the related description of other embodiments. It will be understood that, although the terms first, second, etc. are used herein to distinguish among objects, these objects should not be limited by these terms.

What described above are several embodiments of the present disclosure, but they are not intended to limit the scope of the present disclosure. It will be understood by those skilled in the art that various modifications and improvements can be made without departing from the conception of the present disclosure, and all these modifications and improvements are within the scope of the present disclosure. The scope of the present disclosure shall be subject to the claims attached.

The invention claimed is:

1. A method for health monitoring of System-on-Chip (SoC), comprising:
   acquiring in real time a plurality of sensor data of a plurality of sensors monitoring System-on-Chip (SoC) performance, the sensor data including reliability degradation sensor data, temperature sensor data, noise sensor data and current sensor data; wherein the plurality of sensors include a reliability degradation sensor, a temperature sensor, a noise sensor, and a current sensor;
   extracting a characteristic data representative of the System-on-Chip (SoC) performance from the sensor data;
   performing analysis and prediction on the characteristic data representative in real time by using a prediction algorithm to obtain a real-time performance state and a real-time performance degradation trend of the System-on-Chip (SoC); and
   outputting a real-time prediction testing result including real-time performance state information and real-time performance degradation trend information of the System-on-Chip (SoC); and
   wherein the step of acquiring in real time sensor data of sensors monitoring SoC comprises:
      reading the sensor data of the plurality of sensors monitoring SoC performance in real time directly by pre-set sensor drivers that are directly connected to an operation system kernel; the pre-set sensor drivers are configured and based on the operation system kernel; and wherein the sensor data is acquired by the operation system kernel directly;
      acquiring in real time the sensor data read by the pre-set sensor drivers through a corresponding interface provided by the operation system kernel; and
   wherein, direct monitoring of performance degradation of the SoC is done by the real-time prediction testing result using the real-time characteristic data representative instead of indirectly monitoring performance degradation using actual values of specific electrical characteristics.

2. The method for health monitoring of SoC according to claim 1, wherein the step of outputting performance state information and performance degradation trend information of the SoC comprises:

sending obtained performance state information and performance degradation trend information of the SoC to an application layer, and outputting the performance state and the performance degradation trend by a corresponding application of the application layer.

3. The method for health monitoring of SoC according to claim 1, wherein the reliability degradation sensor data comprises time dependent dielectric breakdown (TDDB) degradation sensor data, hot carrier injection (HCI) degradation sensor data and bias temperature instability (BTI) degradation sensor data.

4. The method for health monitoring of SoC according to claim 1, wherein the step of extracting characteristic data representative of the SoC performance from the sensor data comprises:
   extracting the characteristic data representative of the SoC performance from the sensor data by Gabor transform algorithm or fast Fourier transform algorithm.

5. A device for health monitoring of System-on-Chip (SoC), comprising:
   a data acquisition module, configured to acquire in real time a plurality of sensor data of a plurality of sensors monitoring System-on-Chip (SoC) performance, the sensor data including reliability degradation sensor data, temperature sensor data, noise sensor data and current sensor data; wherein the plurality of sensors include a reliability degradation sensor, a temperature sensor, a noise sensor, and a current sensor;
   an analysis and prediction module, configured to extract a characteristic data representative of the System-on-Chip (SoC) performance from the sensor data and perform analysis and prediction on the characteristic data representative in real time by using a prediction algorithm to obtain a real-time performance state and a real-time performance degradation trend of the System-on-Chip (SoC); and
   an information output module, configured to output a real-time prediction testing result including real-time performance state information and real-time performance degradation trend information of the System-on-Chip (SoC); and
   a plurality of pre-set sensor drivers for reading the sensor data of the plurality of sensors monitoring SoC performance in real time directly; the pre-set sensor drivers are directly connected to an operation system kernel; the pre-set sensor drivers are configured and based on the operation system kernel; and wherein the sensor data is acquired by the operation system kernel directly;
   an interface provided by the operation system kernel for acquiring in real time the sensor data read by the pre-sensor drivers; and
   wherein, direct monitoring of performance degradation of the SoC is done by the real-time prediction testing result using the real-time characteristic data representative instead of indirectly monitoring performance degradation using actual values of specific electrical characteristics.

6. The device for health monitoring of SoC according to claim 5, wherein the reliability degradation sensor data comprises time dependent dielectric breakdown (TDDB) degradation sensor data, hot carrier injection (HCI) degradation sensor data and bias temperature instability (BTI) degradation sensor data.

7. An System-on-Chip (SoC) system, comprising:
   a system hardware layer, a system kernel layer, a system service layer and an application layer;
   wherein, a plurality of sensors of the system hardware layer are configured to monitor SoC performance in real time; wherein the plurality of sensors include a reliability degradation sensor, a temperature sensor, a noise sensor, and a current sensor;
   an operation system kernel of the system kernel layer is configured to acquire in real-time sensor data of the system hardware layer, and transmit the sensor data to the system service layer; the sensor data comprises reliability degradation sensor data, temperature sensor data, noise sensor data and current sensor data;
   a prediction module of the system service layer is configured to extract a characteristic data representative of the System-on-Chip (SoC) performance from the sensor data and perform analysis and prediction on the characteristic data in real-time by using a prediction algorithm to obtain a real-time performance state and a real-time performance degradation trend of the System-on-Chip (SoC); and
   an application pre-set in the application layer is configured to output a real-time prediction testing result including real-time performance state information and real-time performance degradation trend information of the System-on-Chip (SoC) system;
   a plurality of pre-set sensor drivers for reading the sensor data of the plurality of sensors monitoring SoC performance in real time directly; the pre-set sensor drivers are directly connected to the operation system kernel; the pre-set sensor drivers are configured based on the operation system kernel; and wherein the sensor data is acquired by the operation system kernel directly;
   an interface provided by the operation system kernel for acquiring in real time the sensor data read by the pre-sensor drivers; and
   wherein, direct monitoring of performance degradation of the SoC is done by the real-time prediction testing result using the real-time characteristic data representative instead of indirectly monitoring performance degradation using actual values of specific electrical characteristics.

8. The SoC system according to claim 7, wherein the reliability degradation sensor data comprises time dependent dielectric breakdown (TDDB) degradation sensor data, hot carrier injection (HCI) degradation sensor data, bias temperature instability (BTI) degradation sensor data.

* * * * *